United States Patent
Huang et al.

(10) Patent No.: US 9,015,560 B1
(45) Date of Patent: *Apr. 21, 2015

(54) METHOD AND APPARATUS FOR CEASING ACCESS TO A PORTION OF A FLASH MEMORY WHEN LESS THAN A NUMBER OF ERRORS CORRECTABLE BY AN ERROR CORRECTION CODE EXISTS

(71) Applicant: Marvell International Ltd., Hamilton (BM)

(72) Inventors: Chen Kuo Huang, Cupertino, CA (US); Sui-Hung Fred Au, Fremont, CA (US); Xueshi Yang, Cupertino, CA (US); Lau Nguyen, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/284,845

(22) Filed: May 22, 2014

Related U.S. Application Data

(63) Continuation of application No. 14/043,260, filed on Oct. 1, 2013, now Pat. No. 8,738,996, which is a continuation of application No. 12/822,664, filed on Jun. 24, 2010, now Pat. No. 8,549,384.

(60) Provisional application No. 61/220,703, filed on Jun. 26, 2009.

(51) Int. Cl.
| | | |
|---|---|---|
| *G11C 29/00* | (2006.01) | |
| *G06F 11/20* | (2006.01) | |
| *G06F 11/10* | (2006.01) | |
| *G11C 29/24* | (2006.01) | |
| *G11C 29/04* | (2006.01) | |

(52) U.S. Cl.
CPC ............ *G06F 11/2053* (2013.01); *G11C 29/72* (2013.01); *G06F 11/1012* (2013.01); *G11C 29/24* (2013.01); *G11C 2029/0409* (2013.01); *G11C 2029/0411* (2013.01)

(58) Field of Classification Search
CPC . G06F 11/1012; G06F 11/1068; G06F 11/07; G11C 29/24; G11C 29/82; G11C 29/4401; G11C 2029/0409; G11C 2029/0411; G11C 29/72

See application file for complete search history.

(56) References Cited

U.S. PATENT DOCUMENTS

| | | | | |
|---|---|---|---|---|
| 7,721,140 | B2* | 5/2010 | Dell et al. | 714/5.11 |
| 7,954,004 | B2* | 5/2011 | Li | 714/6.13 |
| 8,307,258 | B2* | 11/2012 | Flynn et al. | 714/763 |
| 2010/0050053 | A1* | 2/2010 | Wilson et al. | 714/773 |
| 2010/0070827 | A1* | 3/2010 | Kim et al. | 714/758 |
| 2010/0153821 | A1* | 6/2010 | Keeler et al. | 714/773 |
| 2010/0162083 | A1* | 6/2010 | Chung et al. | 714/764 |

* cited by examiner

*Primary Examiner* — John P Trimmings

(57) ABSTRACT

An integrated circuit including a first interface, a decoder, and a controller. The first interface is configured to (i) write encoded data in a portion of a flash memory, and (ii) read the encoded data back from the flash memory. The decoder is configured to (i) according to an error correction code, decode the encoded data read back from the flash memory, and (ii) based on the decoded data, determine a number of decoding errors corresponding to the decoded data. The controller is configured to, in response to the number of decoding errors being greater than or equal to a first threshold, cease accessing the portion of the flash memory. The first threshold is less than a number of errors correctable by the error correction code for the portion of the flash memory.

20 Claims, 4 Drawing Sheets

METHOD AND APPARATUS FOR CEASING ACCESS TO A PORTION OF A FLASH MEMORY WHEN LESS THAN A NUMBER OF ERRORS CORRECTABLE BY AN ERROR CORRECTION CODE EXISTS

CROSS-REFERENCE TO RELATED APPLICATIONS

The present disclosure is a continuation of U.S. patent application Ser. No. 14/043,260 (now U.S. Pat. No. 8,738, 996), filed Oct. 1, 2013, which is a continuation of U.S. patent application Ser. No. 12/822,664 (now U.S. Pat. No. 8,549, 384), filed Jun. 24, 2010. This application claims the benefit of U.S. Provisional Patent Application No. 61/220,703, filed on Jun. 26, 2009. The entire disclosures of the applications referenced above are incorporated herein by reference.

FIELD

The present disclosure relates generally to flash memory. More particularly, the present disclosure relates to usage and retirement of flash memory cells.

BACKGROUND

Flash memory is a solid-state, non-volatile memory technology. Flash memory has become increasingly popular, and can be found in a broad array of devices. For example, flash memory is currently employed in mobile phones, digital cameras, digital audio players, and computer storage devices referred to as "solid-state drives."

Each cell in a flash memory has a limited number of uses, after which the cell fails. For example, current flash memories guarantee 100,000 write-erase cycles. Flash memories indicate such failures, for example by setting a bit in a status register. Conventional flash memory controllers respond to the failure of a flash cell by "retiring" the cell, that is, by ceasing to use the cell in flash memory operations.

FIG. 1 shows a prior-art process 100 for retiring flash cells. Referring to FIG. 1, a flash memory controller writes data to a location in a flash memory at 102. At 104, if the flash memory does not indicate a write failure, then at 106 the flash memory controller continues to use the location, which includes a plurality of flash memory cells. But if at 104 the flash memory indicates a write failure, then at 108 the flash memory controller retires the location.

SUMMARY

A system is provided and includes a flash memory, an encoder, a first interface, a decoder and a controller. The encoder is configured to (i) receive data, and (ii) encode the data based on an error correction code. The first interface is configured to (i) write the encoded data to a memory cells in the flash memory, and (ii) read the encoded data back from the memory cells. The decoder is configured to (i) decode the encoded data read back from the memory cells, and (ii) based on the decoded data, determine a number of decoding errors for the plurality of memory cells. The controller is configured to, in response to the number of decoding errors being greater than or equal to a first threshold, cease accessing the memory cells. The first threshold is less than a maximum number of errors correctable by the error correction code for the memory cells.

In other features, a method is provided and includes: receiving data from a flash memory at an encoder; encoding the data based on an error correction code; and via a first interface, (i) writing the encoded data to a memory cells in the flash memory, and (ii) reading the encoded data back from the memory cells. The method further includes: decoding the encoded data read back from the memory cells; based on the decoded data, determining a number of decoding errors for the memory cells; and in response to the number of decoding errors being greater than or equal to a first threshold, cease accessing the memory cells. The first threshold is less than a maximum number of errors correctable by the error correction code for the memory cells.

In general, in one aspect, an embodiment features an apparatus comprising: an encoder configured to provide encoded data according to an error correction code; a flash memory interface configured to write the encoded data to a location in flash memory, and to read the encoded data from the location in the flash memory; a decoder configured to decode the encoded data read from the location in the flash memory, and to indicate a number of resulting decode errors; and a retirement module configured to retire the location responsive to a number of resulting decode errors reaching an error threshold T.

Embodiments of the apparatus can include one or more of the following features. In some embodiments, the flash memory interface is further configured to read the encoded data from the location in the flash memory responsive to a write failure indicated by the flash memory for the location. In some embodiments, the error threshold T is selected based on an error threshold of the error correction code. In some embodiments, the error threshold T is selected to be no greater than the error threshold of the error correction code. Some embodiments comprise the flash memory. Some embodiments comprise an integrated circuit comprising the apparatus. Some embodiments comprise a host device configured to provide data to the encoder.

In general, in one aspect, an embodiment features a method comprising: providing encoded data according to an error correction code; writing the encoded data to a location in flash memory; reading the encoded data from the location in the flash memory; decoding the encoded data read from the location in the flash memory, and indicating a number of resulting decode errors; and retiring the location responsive to a number of resulting decode errors reaching an error threshold T.

Embodiments of the method can include one or more of the following features. Some embodiments comprise reading the encoded data from the location in the flash memory responsive to a write failure indicated by the flash memory for the location. Some embodiments comprise selecting the error threshold T based on an error threshold of the error correction code. Some embodiments comprise selecting the error threshold T to be no greater than the error threshold of the error correction code. In some embodiments, providing encoded data according to an error correction code comprises: encoding data. Some embodiments comprise providing the data.

In general, in one aspect, an embodiment features computer-readable media embodying instructions executable by a computer to perform a method comprising: providing encoded data according to an error correction code; writing the encoded data to a location in flash memory; reading the encoded data from the location in the flash memory; decoding the encoded data read from the location in the flash memory, and indicating a number of resulting decode errors; and retiring the location responsive to a number of resulting decode errors reaching a error threshold T.

Embodiments of the computer-readable media can include one or more of the following features. In some embodiments, the method further comprises: reading the encoded data from the location in the flash memory responsive to a write failure indicated by the flash memory for the location. In some embodiments, the method further comprises: selecting the error threshold T based on an error threshold of the error correction code. In some embodiments, the method further comprises: selecting the error threshold T to be no greater than the error threshold of the error correction code. In some embodiments, providing encoded data according to an error correction code comprises: encoding data. In some embodiments, the method further comprises: providing the data.

The details of one or more implementations are set forth in the accompanying drawings and the description below. Other features will be apparent from the description and drawings, and from the claims.

Figure 1:
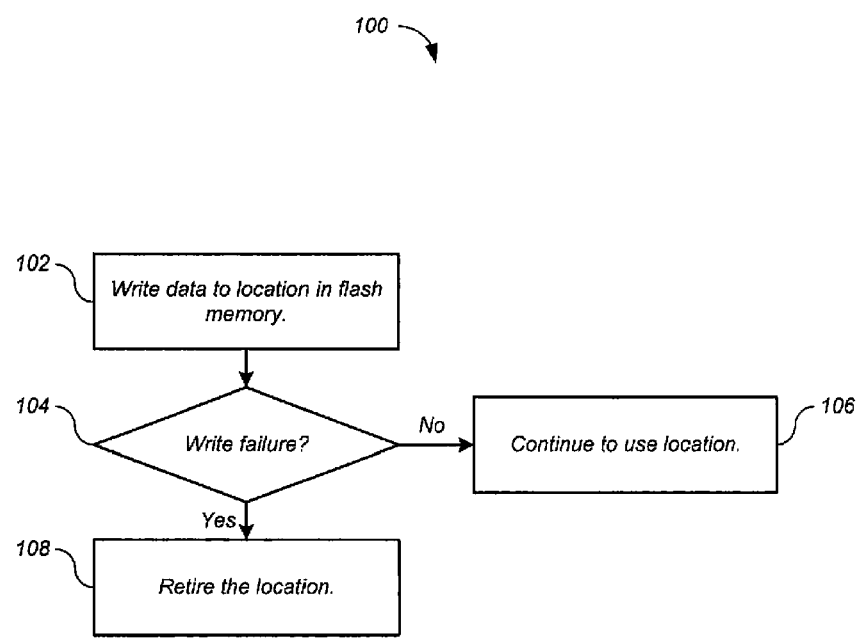
FIG. 1 shows a prior-art process for retiring flash cells.

The leading digit(s) of each reference numeral used in this specification indicates the number of the drawing in which the reference numeral first appears.

DESCRIPTION

Embodiments of the present disclosure provide elements of a flash memory system having improved memory usage. In particular, the disclosed embodiments are capable of continuing to use a flash memory location even after one or more flash memory cells in that location have failed. The disclosed flash memory controllers employ error correction codes to correct data read from flash memory locations having failed cells. The disclosed flash memory controllers continue to use a flash memory location even after a write failure occurs, until the number of decode errors in data read from the flash memory location reaches a threshold T. Only then do the flash memory controllers retire the location. Thus these embodiments enable memory usage exceeding that of conventional techniques.

Figure 2:
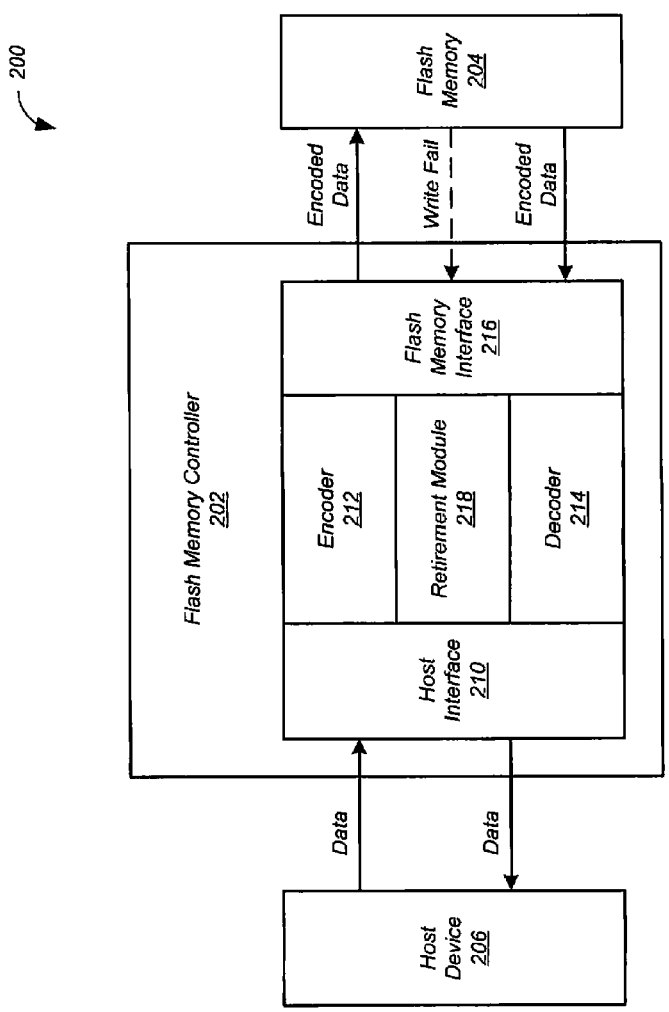
FIG. 2 shows elements of a flash memory system according to one embodiment.

FIG. 2 shows elements of a flash memory system 200 according to one embodiment. Although in the described embodiments the elements of flash memory system 200 are presented in one arrangement, other embodiments may feature other arrangements. For example, elements of flash memory system 200 can be implemented in hardware, software, or combinations thereof.

Referring to FIG. 2, flash memory system 200 includes a flash memory controller 202 in communication with a flash memory 204 and a host device 206. Host device 206 can be implemented as a mobile phone, digital camera, digital audio player, computer, and the like. Flash memory 204 can be implemented as a conventional commercially-available flash memory. Flash memory controller 202 can be implemented as an integrated circuit, either alone or together with other functional blocks. For example, flash memory 204 and flash memory controller 202 can be fabricated together as a single integrated circuit.

Flash memory controller 202 includes a host interface 210 configured to exchange data with host device 206, an encoder 212 configured to encode data received from host device 206 according to an error correction code, a flash memory interface 216 configured to write encoded data to a location in flash memory 204, and to read the encoded data from flash memory 204 responsive to a write failure indicated by flash memory 204 for the location; a decoder 214 to decode the encoded data read from flash memory 204, and to indicate a number of resulting decode errors; and a retirement module 218 to retire the location responsive to the resulting decode errors reaching an error threshold T.

Figure 3:
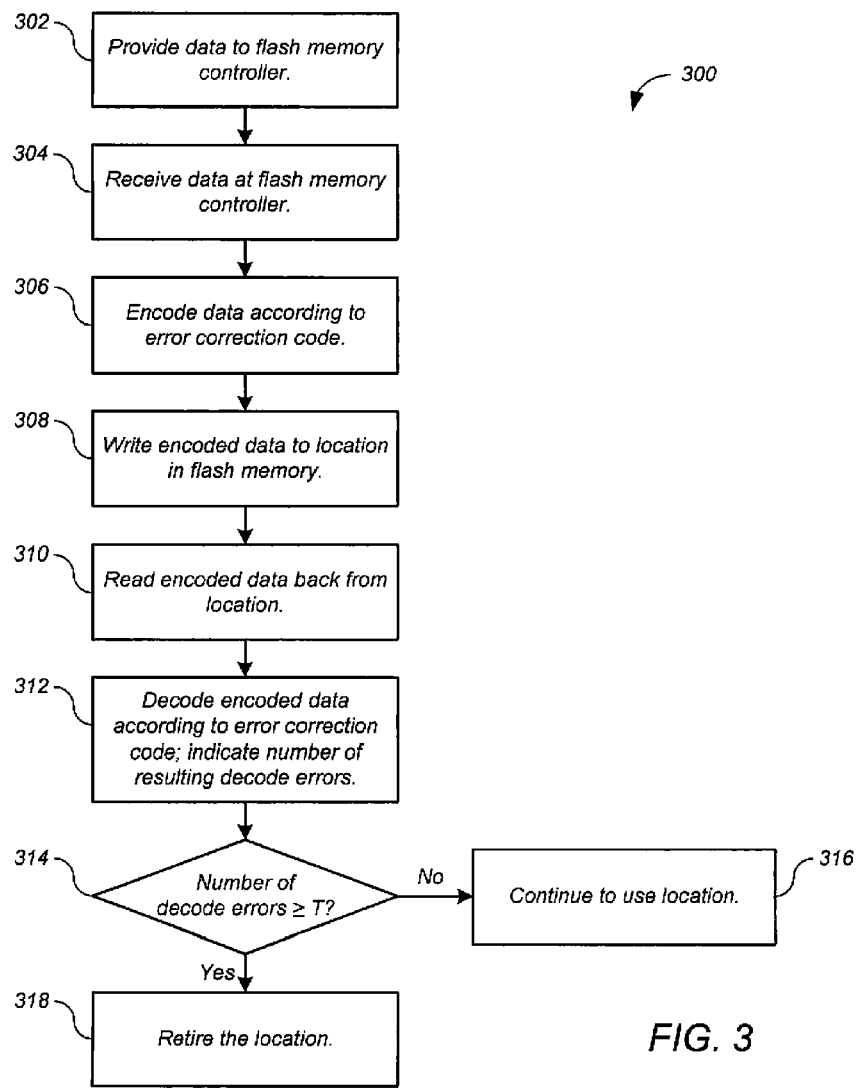
FIG. 3 shows a process operated by the flash memory system of FIG. 2 according to an embodiment that does not employ the write failure indication provided by flash memory.

FIG. 3 shows a process 300 operated by flash memory system 200 of FIG. 2 according to an embodiment that does not employ the write failure indication provided by flash memory 204. Although in the described embodiments the elements of process 300 are presented in one arrangement, other embodiments may feature other arrangements. For example, in various embodiments, some or all of the steps of process 300 can be executed in a different order, concurrently, and the like.

Referring to FIG. 3, at 302 host device 206 provides data to flash memory controller 202. At 304, host interface 210 of flash memory controller 202 receives the data. At 306, encoder 212 of flash memory controller 202 encodes the data according to an error correction code. Embodiments of the present disclosure are independent of error correction code selected. At 308, flash memory interface 216 of flash memory controller 202 writes the encoded data to a location in flash memory 204. The location may include a plurality of flash memory cells. For example, the location can be a flash page, allocation unit, or the like.

After each write operation, flash memory 204 may indicate whether the write operation failed. However, the present embodiment does not employ such write failure indications.

Conventional flash memory controllers respond to the failure of a flash memory location by "retiring" the location, that is, by ceasing to use the location in flash memory operations. In contrast, the present embodiment does not respond to the failure of a flash memory location, but instead independently determines whether the error correction code used can correct for the failure, thereby permitting continued use of the location.

At 310, flash memory interface 216 of flash memory controller 202 reads the encoded data back from the location. At 312 decoder 214 of flash memory controller 202 decodes the encoded data read back from flash memory 204 according to the error correction code, and indicates the number of resulting decode errors. At 314, if the number of resulting decode errors does not reach an error threshold T, then at 316 flash memory controller 202 continues to use the location. But if at 314 the number of resulting decode errors reaches error threshold T, then at 318 retirement module 218 retires the location.

Error threshold T can be selected based on an error threshold of the error correction code. For example, error threshold T can be selected as the maximum number of errors correctable by the error correction code. However, this may cause data to be lost when retiring a location. In particular, if the data read back from a location is uncorrectable, and no other copy of the data exists, the data is lost. Therefore, error threshold T can be selected to be less than the maximum number of errors correctable by the error correction code.

Figure 4:
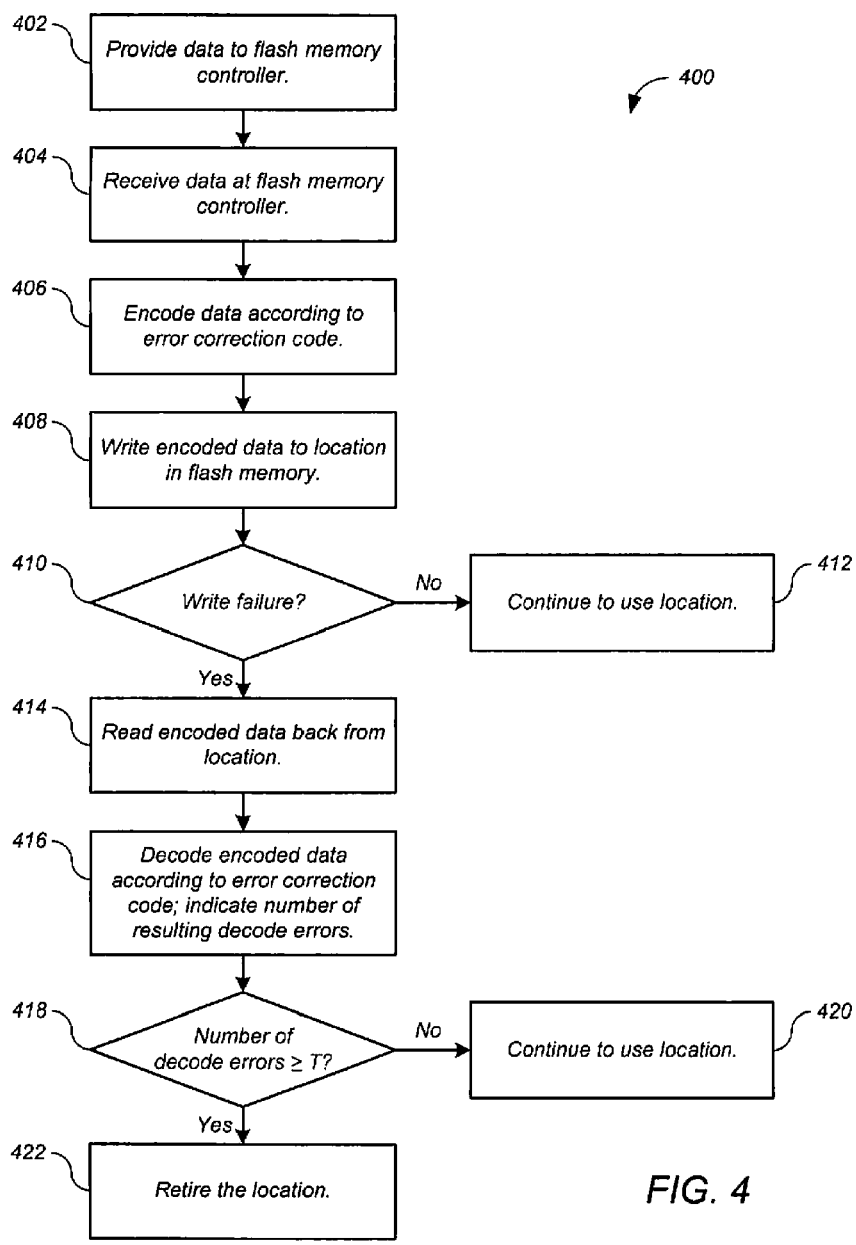
FIG. 4 shows a process operated by the flash memory system of FIG. 2 according to an embodiment that employs the write failure indication provided by flash memory.

FIG. 4 shows a process 400 operated by flash memory system 200 of FIG. 2 according to an embodiment that employs the write failure indication provided by flash memory 204. Although in the described embodiments the elements of process 400 are presented in one arrangement, other embodiments may feature other arrangements. For example, in various embodiments, some or all of the steps of process 400 can be executed in a different order, concurrently, and the like.

Referring to FIG. 4, at 402 host device 206 provides data to flash memory controller 202. At 404, host interface 210 of flash memory controller 202 receives the data. At 406, encoder 212 of flash memory controller 202 encodes the data according to an error correction code. Embodiments of the present disclosure are independent of error correction code selected. At 408, flash memory interface 216 of flash memory controller 202 writes the encoded data to a location in flash memory 204. The location includes a plurality of flash memory cells. For example, the location can be a flash page, allocation unit, or the like.

After each write operation, flash memory 204 indicates whether the write operation failed, for example by setting a bit in a status register that can be read by flash memory controller 202. As another example, flash memory 204 can assert a "write fail" signal when a write operation fails. However, embodiments of the present disclosure are independent of the manner in which flash memory 204 indicates whether the write operation failed.

Conventional flash memory controllers respond to the failure of a flash memory location by "retiring" the location, that is, by ceasing to use the location in flash memory operations. In contrast, embodiments of the present disclosure respond to the failure of a flash memory location by determining whether the error correction code used can correct for the failure, thereby permitting continued use of the location.

At 410, if flash memory 204 does not indicate a write failure, then at 412 flash memory controller 202 continues to use the location. But if at 410 flash memory 204 indicates a write failure, then at 414 flash memory interface 216 of flash memory controller 202 reads the encoded data back from the location. At 416 decoder 214 of flash memory controller 202 decodes the encoded data read back from flash memory 204 according to the error correction code, and indicates the number of resulting decode errors. At 418, if the number of resulting decode errors does not reach a error threshold T, then at 420 flash memory controller 202 continues to use the location. But if at 418 the number of resulting decode errors reaches error threshold T, retirement module 218 retires the location at 422.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An integrated circuit comprising:
   a first interface configured to (i) write encoded data in a portion of a flash memory, and (ii) read the encoded data back from the flash memory;
   a decoder configured to (i) according to an error correction code, decode the encoded data read back from the flash memory, and (ii) based on the decoded data, determine a number of decoding errors corresponding to the decoded data; and
   a controller configured to, in response to the number of decoding errors being greater than or equal to a first threshold, cease accessing the portion of the flash memory, wherein the first threshold is less than a number of errors correctable by the error correction code for the portion of the flash memory.

2. The integrated circuit of claim 1, further comprising the flash memory.

3. The integrated circuit of claim 1, wherein:
   the portion of the flash memory comprises a plurality of memory cells;
   the first interface is configured to (i) write the encoded data to the plurality of memory cells, and (ii) read the encoded data back from the plurality of memory cells; and
   the decoder is configured to (i) decode the encoded data read back from the plurality of memory cells to provide the decoded data, and (ii) based on the decoded data, determine the number of decoding errors for the plurality of memory cells.

4. The integrated circuit of claim 1, further comprising:
   a second interface connected between (i) a host and (ii) the decoder and the controller; and
   an encoder configured to (i) receive data from the host via the second interface, and (ii) based on the error correction code, encode the data received from the second interface to generate the encoded data,
   wherein the second interface is configured to (i) receive the decoded data from the decoder, and (ii) forward the decoded data to the host.

5. The integrated circuit of claim 1, wherein the encoder, the first interface, and the decoder are implemented in the controller.

6. The integrated circuit of claim 1, wherein the controller is configured to, in response to the number of decoding errors being less than the first threshold, continue accessing the portion of the flash memory.

7. The integrated circuit of claim 1, wherein:
the first threshold is based on a maximum number of errors correctable by the error correction code for a plurality of memory cells; and
the flash memory comprises the plurality of memory cells.

8. The integrated circuit of claim 1, wherein the number of decoding errors is indicated in the decoded data.

9. The integrated circuit of claim 1, wherein:
the flash memory is configured to generate a status signal;
the status signal indicates whether a write operation to the portion of the flash memory failed; and
the first interface is configured to (i) cease accessing the portion of the flash memory if the status signal indicates the write operation failed, and (ii) continue accessing the portion of the flash memory if the status signal does not indicate the write operation failed.

10. The integrated circuit of claim 9, wherein the first interface is configured to (i) in response to the number of decoding errors being greater than or equal to the first threshold, cease accessing the portion of the flash memory, and (ii) in response to the number of decoding errors being less than the first threshold, continue accessing the portion of the flash memory.

11. A method comprising:
writing encoded data in a portion of a flash memory;
reading the encoded data back from the flash memory;
according to an error correction code, decoding the encoded data read back from the flash memory;
based on the decoded data, determining a number of decoding errors corresponding to the decoded data; and
in response to the number of decoding errors being greater than or equal to a first threshold, ceasing access to the portion of the flash memory, wherein the first threshold is less than a number of errors correctable by the error correction code for the portion of the flash memory.

12. The method of claim 11, wherein:
the writing of the encoded data, the reading of the encoding data, and the decoding of the encoded data are implemented in an integrated circuit; and
the integrated circuit comprises the flash memory.

13. The method of claim 11, comprising:
writing the encoded data to a plurality of memory cells in the flash memory, wherein the portion of the flash memory comprises the plurality of memory cells; and
reading the encoded data back from the plurality of memory cells.

14. The method of claim 13, comprising:
decoding the encoded data read back from the plurality of memory cells to provide the decoded data; and
based on the decoded data, determining the number of decoding errors for the plurality of memory cells.

15. The method of claim 11, further comprising:
receiving data from a host via a second interface;
based on the error correction code, encoding the data received from the second interface to generate the encoded data;
receiving the decoded data from a decoder at the second interface; and
forwarding the decoded data to the host.

16. The method of claim 15, wherein:
the data received from the host is encoded via an encoder;
the encoded data is decoded via the decoder;
the encoded data is written to the flash memory via an interface;
the number of decoding errors is determined by a controller; and
the encoder, the decoder, the interface and the controller are implemented in an integrated circuit.

17. The method of claim 11, further comprising, in response to the number of decoding errors being less than the first threshold, continuing to access the portion of the flash memory.

18. The method of claim 11, wherein:
the first threshold is based on a maximum number of errors correctable by the error correction code for a plurality of memory cells; and
the flash memory comprises the plurality of memory cells.

19. The method of claim 11, further comprising indicating the number of decoding errors in the decoded data.

20. The method of claim 11, further comprising:
generating a status signal via the flash memory, wherein the status signal indicates whether a write operation to the portion of the flash memory failed;
ceasing access to the portion of the flash memory if the status signal indicates the write operation failed; and
continuing to access the portion of the flash memory if the status signal does not indicate the write operation failed.

* * * * *